(12) United States Patent
Paek et al.

(10) Patent No.: US 11,764,161 B2
(45) Date of Patent: Sep. 19, 2023

(54) GROUND CONNECTION FOR SEMICONDUCTOR DEVICE ASSEMBLY

(71) Applicant: Micron Technology, Inc., Boise, ID (US)

(72) Inventors: Jong Sik Paek, Taichung (TW); Youngik Kwon, Taichung (TW); Yeongbeom Ko, Taichung (TW)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 16/706,443

(22) Filed: Dec. 6, 2019

(65) Prior Publication Data

US 2021/0175182 A1 Jun. 10, 2021

(51) Int. Cl.
*H01L 23/552* (2006.01)
*H01L 23/498* (2006.01)
*H01L 25/065* (2023.01)
*H01L 21/78* (2006.01)
*H01L 23/31* (2006.01)
*H01L 21/56* (2006.01)
*H01L 23/00* (2006.01)

(52) U.S. Cl.
CPC ........ *H01L 23/552* (2013.01); *H01L 21/561* (2013.01); *H01L 21/78* (2013.01); *H01L 23/3128* (2013.01); *H01L 23/49811* (2013.01); *H01L 24/48* (2013.01); *H01L 25/0657* (2013.01); *H01L 2224/48227* (2013.01); *H01L 2225/0651* (2013.01); *H01L 2225/06562* (2013.01)

(58) Field of Classification Search
CPC ........... H01L 23/552; H01L 23/3128; H01L 23/49811; H01L 21/561; H01L 21/78; H01L 24/48; H01L 25/0657; H01L 2224/48227; H01L 2225/0651; H01L 2225/06562
See application file for complete search history.

(56) References Cited

U.S. PATENT DOCUMENTS

2009/0152688 A1\* 6/2009 Do ................... H01L 23/552
257/659
2013/0256847 A1\* 10/2013 Park ................. H01L 21/4817
257/659

(Continued)

*Primary Examiner* — Timor Karimy
(74) *Attorney, Agent, or Firm* — Perkins Coie LLP

(57) ABSTRACT

Semiconductor device assemblies with improved ground connections, and associated systems and methods are disclosed. In one embodiment, a semiconductor device assembly may include one or more semiconductor dies mounted on an upper surface of a package substrate. Further, the package substrate includes a bond pad disposed on the upper surface, which may be designated as a ground node for the semiconductor device assembly. The bond pad may be electrically connected to an electromagnetic interference (EMI) shield of the semiconductor device assembly through a conductive component attached to the bond pad and configured to be in contact with the EMI shield at a sidewall surface or a top surface of the semiconductor device assembly, thereby forming the ground connection. Such ground connection may reduce a processing time to form the EMI shield while improving yield and reliability performance of the semiconductor device assemblies.

8 Claims, 11 Drawing Sheets

(56) References Cited

U.S. PATENT DOCUMENTS

| | | | |
|---|---|---|---|
| 2015/0044823 A1* | 2/2015 | Mohammed | H01L 21/4885 |
| | | | 438/126 |
| 2016/0172309 A1* | 6/2016 | Gong | H01L 23/552 |
| | | | 257/659 |
| 2019/0206930 A1* | 7/2019 | Gao | H01L 43/12 |
| 2020/0020643 A1* | 1/2020 | Yu | H01L 25/50 |

* cited by examiner

US 11,764,161 B2

GROUND CONNECTION FOR SEMICONDUCTOR DEVICE ASSEMBLY

TECHNICAL FIELD

The present disclosure generally relates to semiconductor device assemblies, and more particularly relates to a ground connection for a semiconductor device assembly.

BACKGROUND

Semiconductor packages typically include a semiconductor die (e.g., memory chip, microprocessor chip, imager chip) mounted on a substrate, encased in a protective covering. The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

In some semiconductor packages, metallic layers may be formed on the semiconductor packages to shield undesired electromagnetic interference (EMI) effect. The metallic layers for electromagnetic shielding (which may be referred to as EMI shields) are intended to form electrically conductive connections to common voltage nodes of the semiconductor packages (e.g., ground nodes), which may be located on bottom surfaces of the semiconductor packages. In some examples, the EMI shields may suffer from unreliable connections (e.g., due to discontinuities) between the metallic layers and the ground nodes of the semiconductor packages. In other examples, the EMI shields may suffer from unintended electrical connections between the metallic layers and other nodes than the ground nodes—e.g., when an excessive amount of metallic material is deposited to avoid the unreliable connections.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments of semiconductor device assemblies having ground connections at their sidewall or top surfaces and associated systems and methods are described below. The ground connections formed at the sidewall or top surfaces may provide improved electrical characteristics (e.g., reduced incidents of forming undesired shorts or opens) and a reduced cost of the process steps for forming EMI shields for the semiconductor device assemblies. Such ground connections may include sacrificial wires or other conductive features dedicated to make electrical connections to the EMI shields.

The term "semiconductor device or die" generally refers to a solid-state device that includes one or more semiconductor materials. Examples of semiconductor devices include logic devices, memory devices, microprocessors, or diodes, among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level.

Further, unless the context indicates otherwise, structures disclosed herein can be formed using conventional semiconductor-manufacturing techniques. Materials can be deposited, for example, using chemical vapor deposition (CVD), physical vapor deposition (PVD), atomic layer deposition (ALD), spin coating, plating, and/or other suitable techniques. Similarly, materials can be removed, for example, using plasma etching, wet etching, chemical-mechanical planarization (CMP), or other suitable techniques, some of which may be combined with photolithography steps. A person skilled in the relevant art will also understand that the present technology may have additional embodiments, and that the present technology may be practiced without several of the details of the embodiments described herein with reference to FIGS. 2 through 9.

As used herein, the terms "vertical," "lateral," "down," "up," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations.

Figure 1:
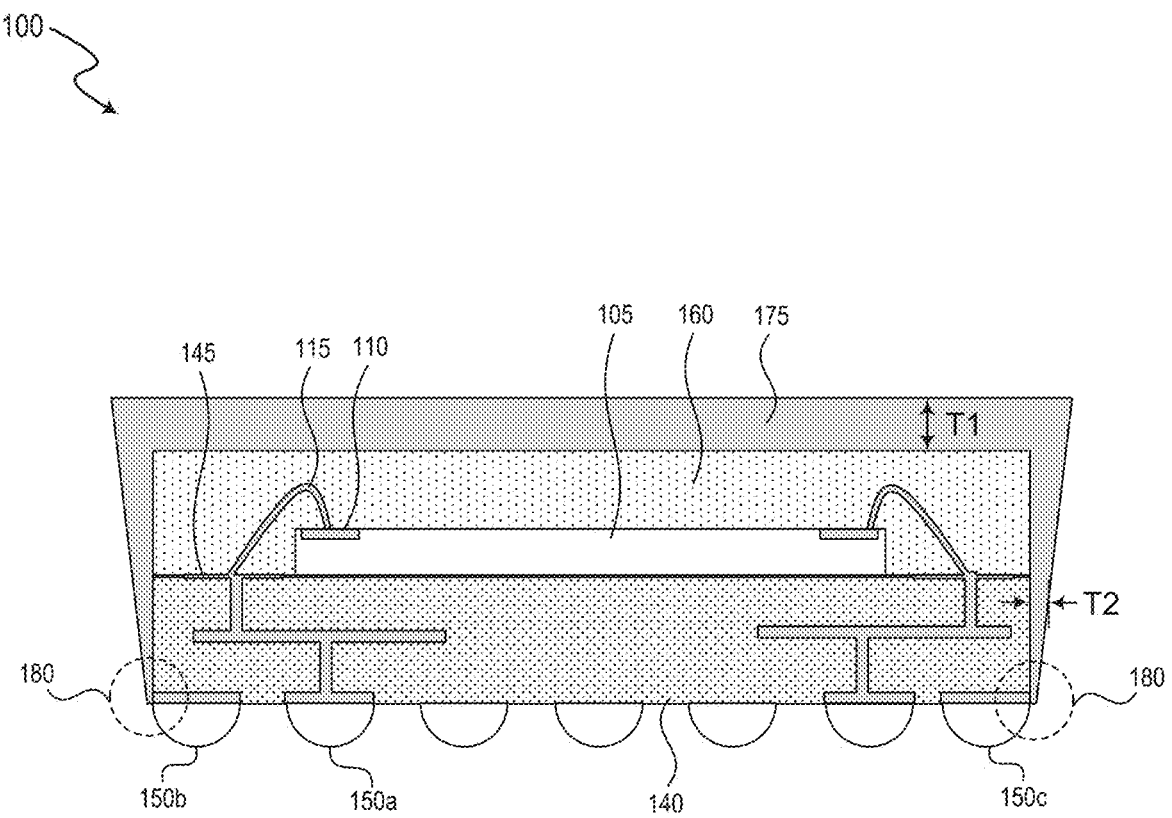
FIG. 1 illustrates a cross-sectional diagram of an exemplary semiconductor device assembly.

FIG. 1 illustrates a cross-sectional diagram 100 of an exemplary semiconductor device assembly. The semiconductor device assembly depicted in the diagram 100 includes a semiconductor die 105 mounted on a substrate 140 (e.g., a printed circuit board (PCB)). The semiconductor die 105 includes bond pads 110 that are connected to various functional features of the semiconductor die 105. The bond pads 110 of the semiconductor die 105 are connected to corresponding bond pads 145 of the substrate 140 through bond wires 115. The bond pads 145 are further connected to terminals 150 (e.g., terminals of a ball-grid array (BGA)) formed on a bottom surface of the substrate 140. Further, the substrate 140 may include interconnects (e.g., Cu traces) to couple the bond pads 145 to corresponding terminals 150—e.g., the bond pad 145 connected to the terminal 150a.

Some of the terminals 150 may be designated to provide a common voltage node (e.g., a ground node) for the semiconductor device assembly—e.g., terminal 150b and terminal 150c, which may be referred to as ground terminals or ground pins. The ground terminals may be located at the periphery or near the edge of the bottom surface. Additionally, the semiconductor device assembly includes a package casing 160 formed on the substrate 140 with an encapsulant enclosing the semiconductor die 105 and the bond wires 115. The encapsulant of the package casing 160 may protect the semiconductor die 105 and provide mechanical supports for the bond wires 115 during subsequent processing steps or during the lifetime of the semiconductor device assembly.

Additionally, the diagram 101 includes an EMI shield 175 that can be formed by depositing one or more metallic materials, e.g., using PVD process steps or sputtering process steps. As the PVD process steps (or the sputtering process steps) typically form a thicker film on an upper surface (e.g., a planar surface) than on a sidewall surface of a package assembly (which may be referred to as breadloafing or step coverage limitations), the thickness T1 of the EMI shield 175 on the top surface is greater than the thickness T2 of the EMI shield 175 on the sidewall surface of the semiconductor device assembly. The EMI shield 175 is devised to connect to the ground terminals (e.g., the ground terminal 150b, the ground terminal 150c) when a target thickness of metallic materials is deposited on the sidewall surface proximate to the ground terminals, as depicted within dotted circles 180. As illustrated in the diagram 100, however, the thickness of the EMI shield 175 deposited proximate to the ground terminals is likely to correspond to a thin (if not the thinnest) portion of the EMI shield 175.

Drawbacks associated with the EMI shield 175 devised to connect to the ground terminals located on the bottom surface of the substrate 140 includes insufficient metallic materials deposited proximate to the ground terminals, due to the step coverage limitation in some instances. Insufficient metallic materials (e.g., discontinuities in electrically conductive connections) tend to generate opens between the EMI shield 175 and the ground terminals, as well as metal burrs, peelings, or the like. Further, the process steps to form the EMI shield 175 may have a higher cost due to a longer-than-desired process time to ensure an adequate metal thickness to minimize opens between the EMI shield 175 and the ground terminals. Additionally, the drawbacks include issues related to metal back-spilling (e.g., a portion of metallic materials deposited on the bottom surface of the substrate 140 when an excessive amount of metallic materials is deposited on the sidewall surface of the substrate 140), which tend to cause unwanted electrical connections (e.g., shorts) between the EMI shield 175 and terminals other than the ground terminals.

To overcome the foregoing challenges, embodiments of the present technology provide a semiconductor device assembly having a ground connection to an EMI shield at a sidewall surface or a top surface of the assembly. The assembly includes a substrate with one or more ground bond pads disposed on the substrate's upper surface. Further, conductive components (e.g., bond wires) are attached to the ground bond pads such that some portions of the conductive components may be exposed at the sidewall surface or the top surface of the assembly (e.g., a package casing). In some cases, the conductive components may be exposed as a result of a dicing process that singulates the assembly. In some cases, a strip grinding process may be carried out to expose the conductive components. The exposed portions of conductive components are connected to the EMI shield while the EMI shield is deposited on the package casing.

FIGS. 2A through 2E illustrate a process of forming ground connections for semiconductor device assemblies ("assemblies") in accordance with an embodiment of the present technology. Individual semiconductor device assembly may include one or more semiconductor dies mounted on a package support substrate ("substrate" or "package substrate"). The package support substrate may include a bond pad for a common voltage node (e.g., a ground node) of the assembly, where the bond pad is formed on an upper surface of the package substrate to which the one or more semiconductor dies are mounted. As described herein, the ground connections may be formed to connect the bond pad to an EMI shield of the assembly at the sidewall or top surfaces of the assembly. That is, the ground connection (e.g., a wire, a conductive component) may extend from the package substrate (e.g., from the bond pad of the package substrate) and terminate at an exterior surface of a package casing (e.g., encapsulation of the assembly) to connect to a conductive housing component for the assembly (e.g., a conductive shield, an EMI shield). Such ground connections may reduce a processing time to form EMI shields (e.g., a reduced cost of the process steps to form the EMI shields), mitigate reliability concerns (e.g., reduced incidents of opens between the EMI shields and the ground nodes, reduced metal burrs or peeling), and improve yield (e.g., reduced incidents of undesired shorts between the EMI shields and the ground nodes).

Figure 2A:
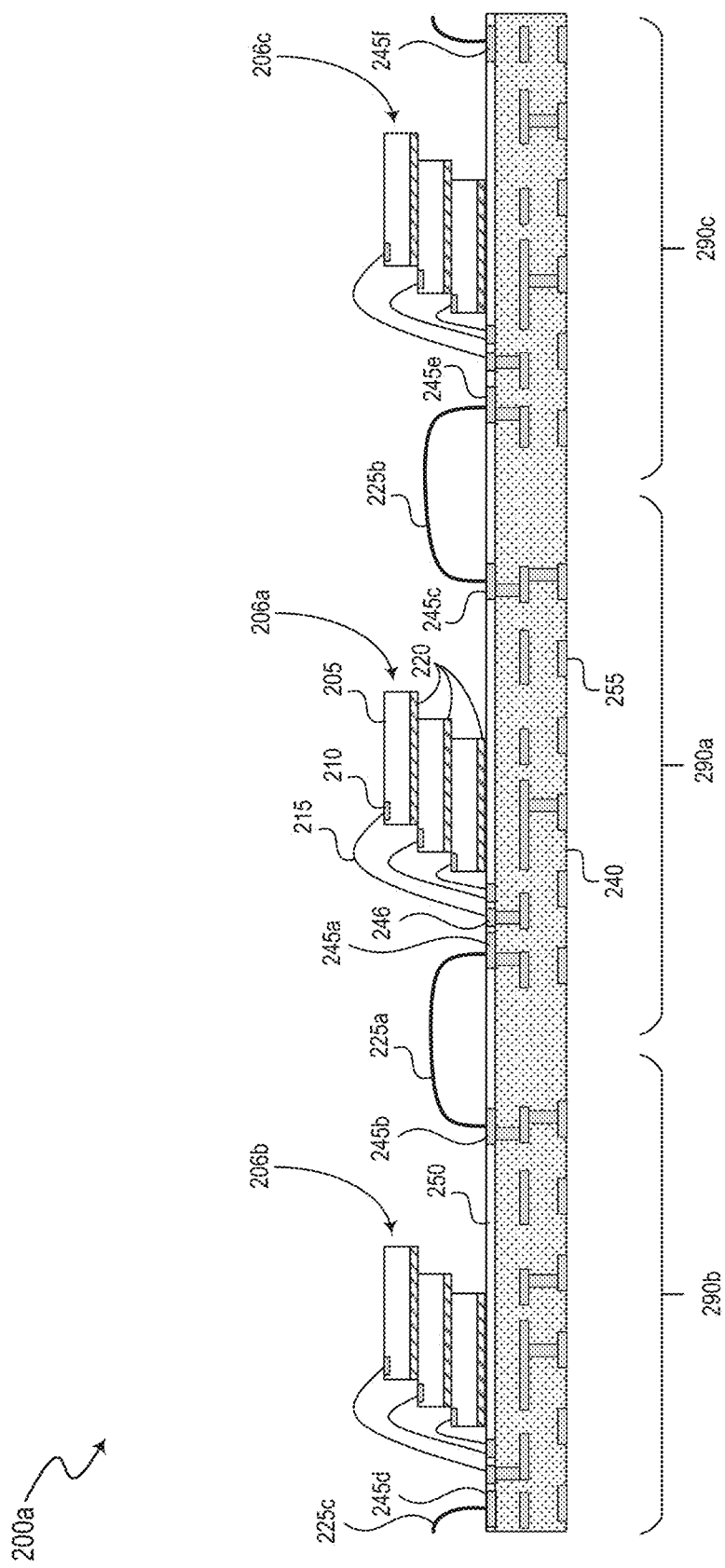
FIGS. 2A through 2E illustrate a process of forming ground connections for semiconductor device assemblies in accordance with an embodiment of the present technology.

FIG. 2A illustrates a cross-sectional diagram 200a including die stacks 206 (e.g., die stacks 206a-206c each including three semiconductor dies 205 arranged in a stack) attached to a package support substrate 240 (e.g., a PCB) via an adhesive layer 220 (e.g., die-attach film (DAF)). Each die stack 206 may correspond to semiconductor device assemblies 290 (e.g., die stack 206a corresponding to semiconductor device assembly 290a) after completing the assembly process steps. Further, the semiconductor dies 205 (e.g., semiconductor memory dies) of the die stack 206 include bond pads 210 that may be coupled with various functional features (e.g., a memory array, control circuitry, input/output components) of the semiconductor dies 205. Bond pads 210 may be connected to corresponding bond pads (e.g., bond pads 246) formed on an upper surface of the package support substrate 240, via bond wires 215. The bond wires 215 may carry active signals related to operations of the semiconductor dies 205 (e.g., voltages and/or currents associated with data signals or control signals of the semiconductor dies 205) between the die stack 206 and the package support substrate 240. The package support substrate 240 also includes additional bond pads (e.g., bond pads 245) formed on the upper surface of the package support substrate 240. Remaining areas of the package support substrate 240 (i.e., the areas unoccupied by the bond pads) may be covered with a passivation layer 250. In some embodiments the passivation layer 250 may include a dielectric material (e.g., a solder resist).

The bond pads on the upper surface of the package support substrate 240 (e.g., bond pads 245, bond pads 246) may be coupled with corresponding conductive structures 255 formed on a lower surface (e.g., a bottom surface) of the package support substrate 240, through interconnects (e.g., Cu traces, Cu vias) formed in the package support substrate 240. In some cases, the conductive structures 255 may include corresponding terminals of LGA (land grid array) or BGA.

In some embodiments, the bond pads 245 of the package support substrate 240 may be designated to provide a common voltage node (e.g., a ground voltage or a ground node) for the semiconductor device assemblies 290. As such, bond pads 245 may be referred to as ground bond pads for the semiconductor device assemblies 290. In some embodiments, conductive components 225 (e.g., conductive component 225a) may be formed to connect two or more ground bond pads (e.g., bond pad 245a for the semiconductor device assembly 290a and bond pad 245b for the semiconductor device assembly 290b) that are separated by a dicing lane (e.g., dicing lane 265 in FIG. 2C). In some embodiments, the conductive component 225 may formed using a bond wire (e.g., the bond wire 215). In other embodiments, the conductive component 225 may have a cross-sectional area greater than that of the bond wire—i.e., the conductive component 225 may be sturdier (e.g., stronger) to maintain its bridge-like shape during subsequent process steps (e.g., process steps that forms a package casing by depositing an encapsulant). The conductive components 225 may be referred to as sacrificial wires because no active signals related to operations of the semiconductor dies 205 (e.g., voltages and/or currents associated with data signals or control signals of the semiconductor dies 205) may be routed through the conductive components 225. In some embodiments, one or more bond pads 245 (e.g., ground bond pad 245a for the assembly 290a) may be coupled with ground nodes of the semiconductor dies 205 included in the die stack 206a.

Figure 2B:
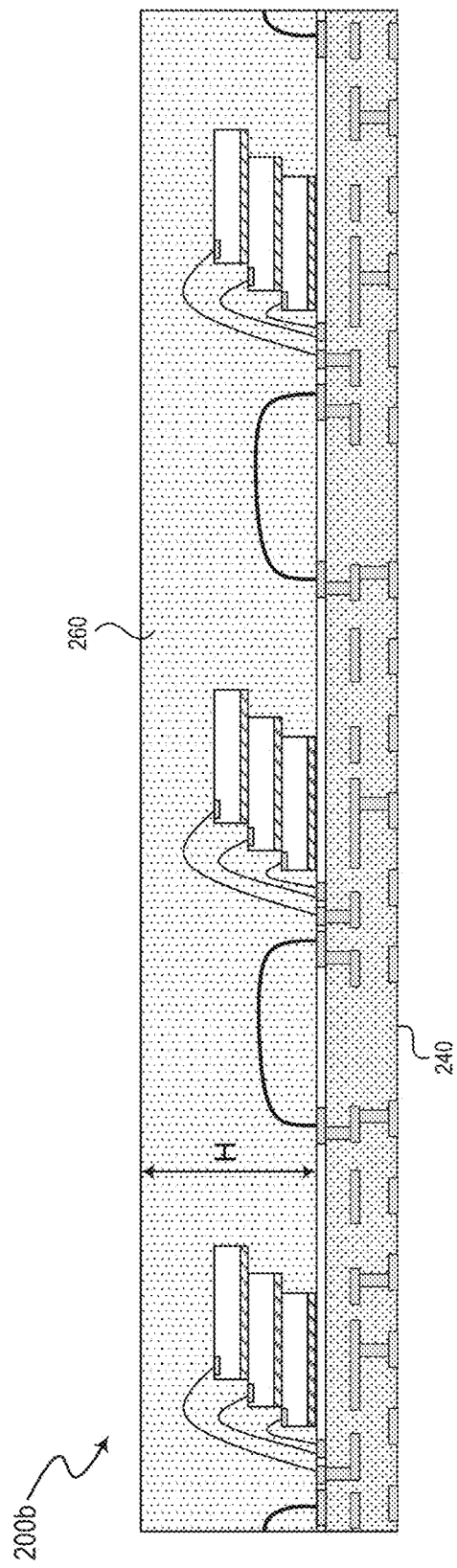
Figure 2C:
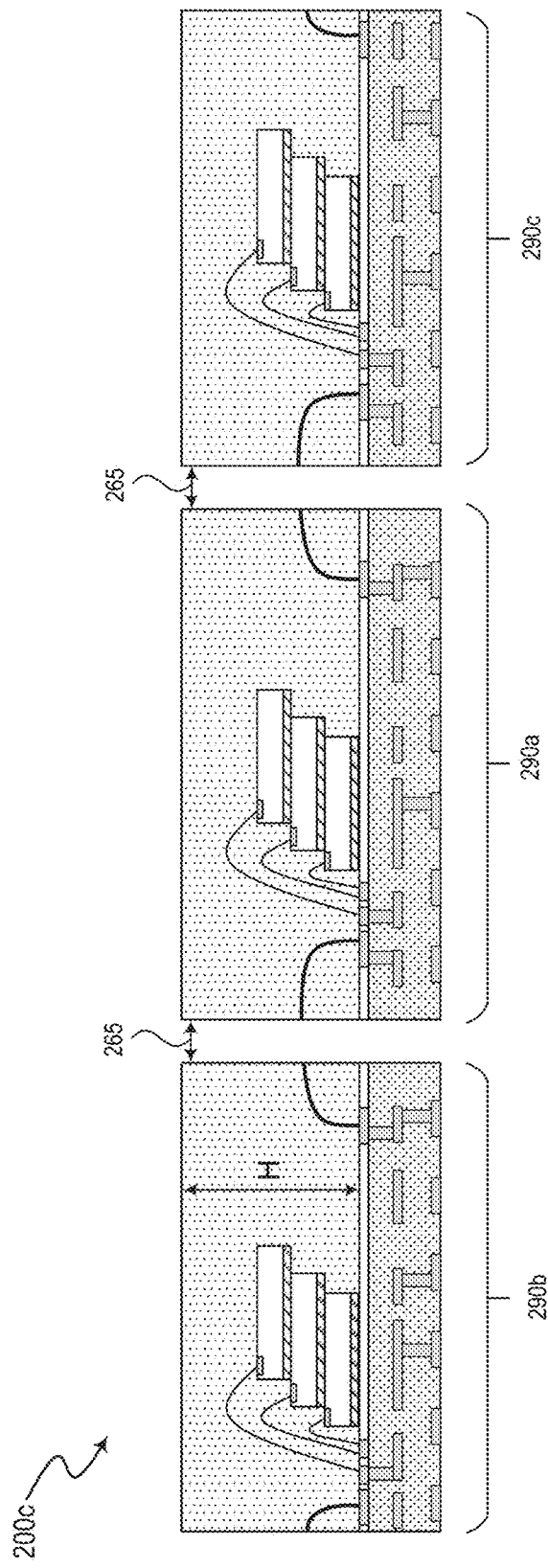

FIG. 2B illustrates a cross-sectional diagram 200b of the die stacks 206 attached to the package support substrate 240 after forming a package casing 260 with an encapsulant (e.g., epoxy molding compound) on the package support substrate 240. The encapsulant of package casing 260 encloses the die stacks 206 and the conductive components 225, among others. The height H of the package casing 260 (i.e., the thickness of the encapsulant with respect to the top surface of the package support substrate 240) may be determined based on a target height dimension of the semiconductor device assemblies 290 including the package casing 260 and the package support substrate 240. Subsequently, the package support substrate 240 with the package casing 260 formed thereon may be diced through the dicing lanes 265 to singulate (e.g., isolate) individual semiconductor device assemblies 290 ("assemblies 290") as illustrated in the diagram 200c of FIG. 2C.

Figure 2D:
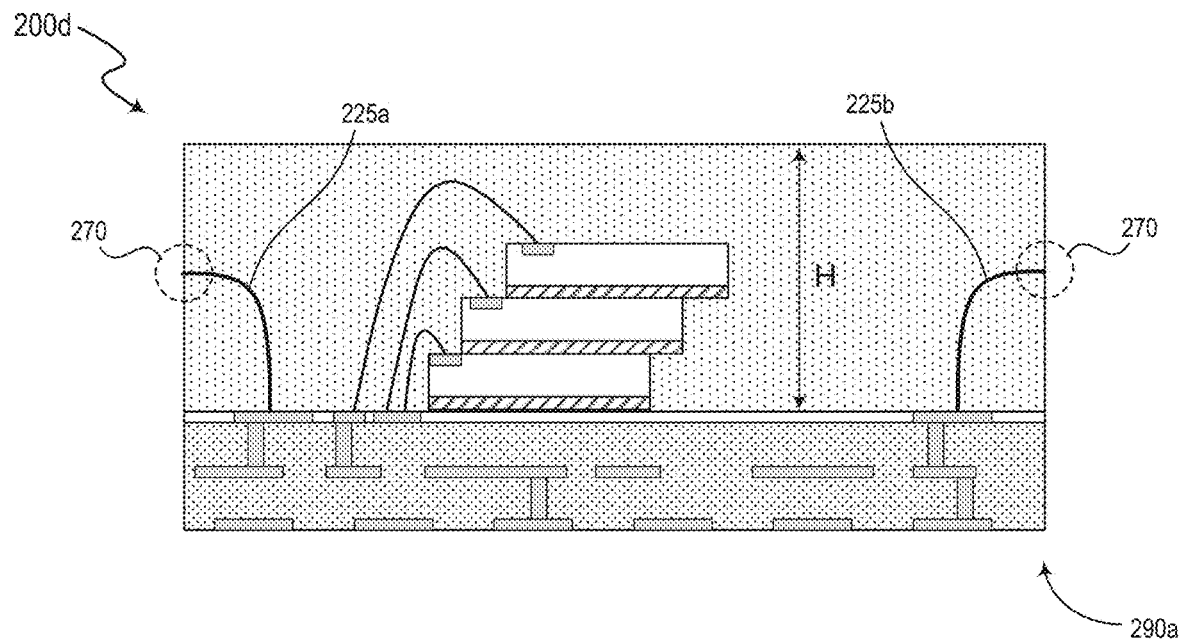

FIG. 2D illustrates a cross-sectional diagram 200d of the singulated semiconductor device assemblies (e.g., semiconductor device assembly 290a) to highlight that a portion of the conductive component 225 is exposed (as depicted within the dotted circles 270) as a result of singulating the semiconductor device assemblies through the dicing lanes 265. Subsequently, a conductive shield 275 (e.g., an EMI shield) may be formed on the top and sidewall surfaces of the semiconductor device assembly 290a (e.g., the top surface of the package casing 260 and sidewall surfaces of the singulated package casing 260 and the singulated package support substrate 240) as shown in the cross-sectional diagram 200e of FIG. 2E. That is, the conductive shield 275 surrounds the package casing 260 and a perimeter of the package support substrate 240. The conductive shield 275 may be referred to as a conductive housing component. In some embodiments, the conductive shield 275 may include copper (Cu), an alloy of chromium (Cr) and nickel (Ni), or both.

The conductive shield 275 may be connected to the exposed portions of the conductive components 225 at the sidewall surface of the singulated package casing 260. In this manner, the thickness T4 of the conductive shield 275 at the bottom corner of the singulated package support substrate 240 may become less critical (e.g., due to absence of the requirement to make an electrical connection to a ground terminal on the bottom surface of the singulated package support substrate 240) so long as the thickness T4 is adequate for shielding the EMI effect. In some embodiments, the thickness T4 may be approximately 0.5 μm or less. As such, the process time to form the conductive shield 275 (e.g., PVD process steps, sputtering process steps) may be targeted to mitigate certain issues described herein with reference to FIG. 1—e.g., avoiding the metal back-spilling issues. Additionally or alternatively, the sidewall surface of the assembly 290a may be sloped (e.g., having an area of the lower surface of assembly 290a that is greater than that of the upper surface of assembly 290a) to lessen the step coverage issues.

Figure 2E:
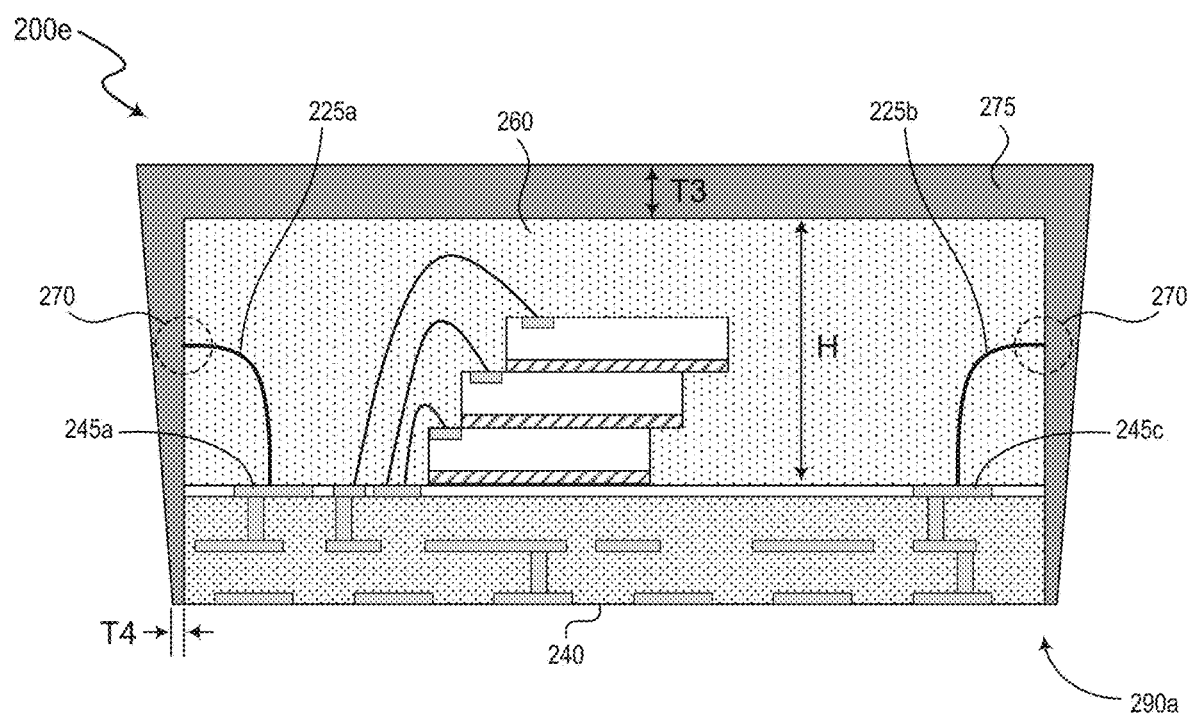

Further, the electrical connections between the conductive shield 275 and the ground bond pads (e.g., bond pads 245a and 245c) are achieved at relatively higher locations in the semiconductor device assembly 290a (e.g., at the locations that are less prone to the step coverage issue) to reduce the process time to form the conductive shield 275 because the thickness T3 of FIG. 2E may be less than the thickness T1 of FIG. 1—e.g., facilitating a reduced process cost due to a less throughput time and reduced amount of metallic materials consumed. In some embodiments, the thickness T3 may be approximately 1 μm or less. Moreover, the package support substrate 240 having the ground bond pads formed on the upper surface may provide a flexibility in designing interconnect routings between the bond pads and the conductive structures 255 of the package support substrate 240 because the requirement to have ground terminals at the periphery of the lower surface of the package support substrate 240 no longer exists.

Figure 3:
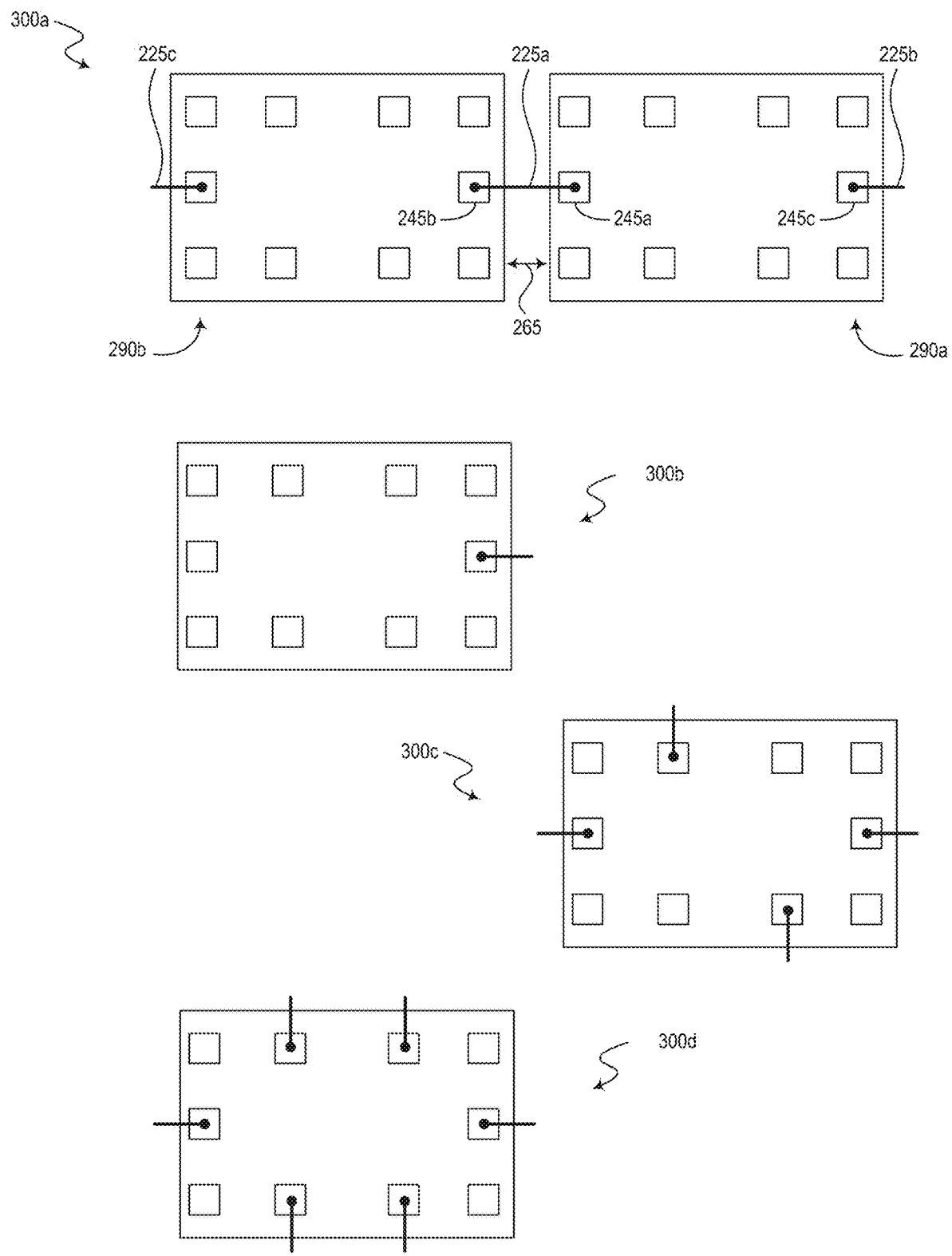
FIG. 3 illustrates plan-view diagrams of ground connections for semiconductor device assemblies in accordance with embodiments of the present technology.

FIG. 3 illustrates plan-view diagrams 300 of semiconductor device assemblies in accordance with embodiments of the present technology. The diagrams 300 includes aspects of various features and components described with reference to FIGS. 2A through 2E. For example, the diagrams 300 illustrate semiconductor device assemblies that are examples of or include aspects of the assemblies 290 described with reference to FIGS. 2A through 2E. Further, the diagrams 300 depict the bond pads 245 of the package support substrate 240 and the conductive components 225 described with reference to FIGS. 2A through 2E. Other features (e.g., die stacks 206 including semiconductor dies 205, bond wires 215) are omitted for clarity and simplicity of illustrating principles of the present technology.

Diagram 300a includes two semiconductor device assemblies (e.g., assembly 290a, assembly 290b) before they are singulated through the dicing lane 265. The conductive component 225a connects the bond pad 245a and the bond pad 245b (e.g., ground bond pads) for the semiconductor device assemblies (e.g., ground bond pad 245a for assembly 290a, ground bond pad 245b for assembly 290b). Further, the semiconductor device assemblies may include additional conductive components 225 (e.g., conductive component 225b for assembly 290a, conductive component 225c for assembly 290b). In this manner, when the semiconductor device assemblies 290 are singulated, individual assemblies 290 are configured to include two (2) conductive components 225 with a portion (e.g., terminated or severed ends of the conductive components 225 as a result of the dicing process) exposed to the subsequent process steps to form the conductive shield 275 as described with reference to FIG. 2E.

In some embodiments, a semiconductor device assembly may include, after having been singulated, one conductive component 225 configured to connect with the conductive shield 275 as illustrated in the diagram 300*b*. In some embodiments, a semiconductor device assembly may include a conductive component 225 per side configured to connect with the conductive shield 275 as illustrated in the diagram 300*c*. In some embodiments, a semiconductor device assembly may include one or more conductive components 225 per side configured to connect with the conductive shield 275 as illustrated in the diagram 300*d*. Various features depicted in the diagrams 300 are exemplary features and the present technology is not limited thereto. For example, a semiconductor device assembly may include a greater (or less) quantity of bond pads 245 than the ten (10) bond pads 245 depicted in the semiconductor device assemblies of FIG. 3. Further, a semiconductor device assembly may include a different quantity of conductive components 225 (e.g., three, five, eight, or even more) configured to connect with the conductive shield 275 than those (e.g., one, two, four, six) depicted in the semiconductor device assemblies of FIG. 3.

Figure 4:
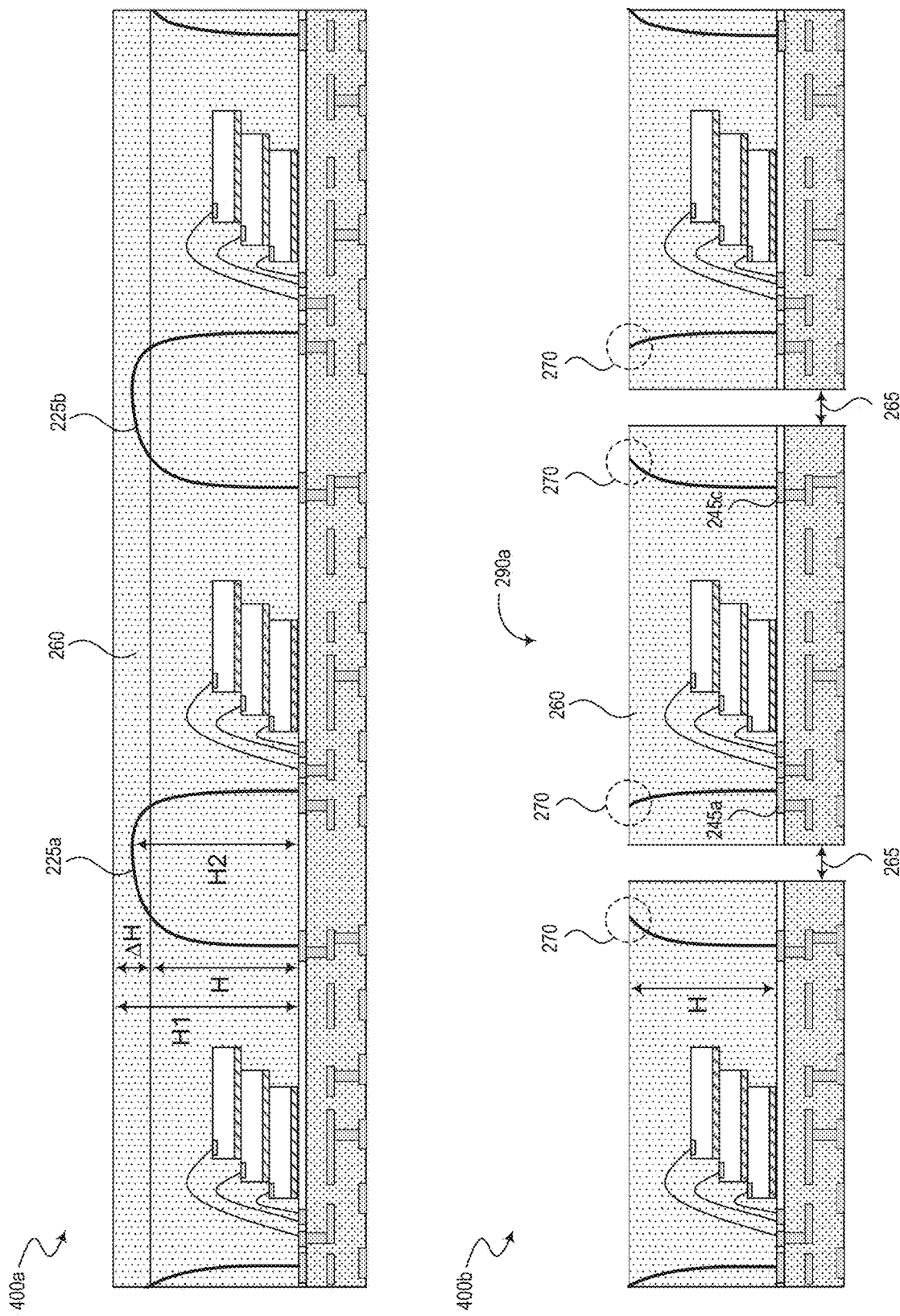
FIGS. 4 through 6 illustrate variations in forming ground connections for semiconductor device assemblies in accordance with embodiments of the present technology.

FIG. 4 includes cross-sectional diagrams 400 to illustrate a variation in forming ground connections for semiconductor device assemblies in accordance with an embodiment of the present technology. Diagram 400*a* depicts the die stacks 206 attached to the package support substrate 240, which correspond to the die stacks 206 attached to the package support substrate 240 depicted in the diagram 200*b* of FIG. 2B, except that the thickness H1 of the package casing 260 (e.g., as deposited) and the height H2 of the conductive components 225 is greater than the thickness H of the package casing 260 depicted in the diagram 200*b*. Further, the thickness H1 of the package casing 260 is greater than the height H2 of the conductive components 225 such that the conductive components 225 is enclosed within the package casing 260 (as deposited).

Subsequently, a top portion of the package casing 260 (i.e., the portion corresponding to the thickness ΔH of the package casing 260) may be removed (e.g., using CMP process steps, strip grinding process steps, or other suitable process steps) as depicted in the diagram 400*b*. The final thickness of the encapsulant of the package casing 260 may be determined to maintain the target height dimension of the semiconductor device assemblies 290 (e.g., the thickness H of the encapsulant described with reference to FIGS. 2B through 2E). As a result of removing the top portion of the package casing 260, the looping portion of the conductive components 225 may be removed to expose portions of the conductive components 225 at the top surface of the package casing 260 (as denoted with the dotted circles 270). Subsequently, the package casing 260 and the package support substrate 240 may be diced through the dicing lanes 265 to singulate the semiconductor device assemblies 290 (e.g., assembly 290*a*).

When the conductive shields 275 (not shown) is formed on the singulated semiconductor device assemblies (e.g., semiconductor device assembly 290*a*), respectively, the exposed portions of conductive components 225 may be connected to the conductive shield 275 such that the ground bond pads (e.g., bond pad 245*a*, bond pad 245*c*) may be connected to the conductive shields 275 at the top surface of the package casing 260. In some embodiments, the conductive components 225 may be mechanically sturdier than bond wires (e.g., bond wires 215 described with reference to FIG. 2A) to maintain the overall shape of the conductive components 225 during subsequent process steps (e.g., depositing the encapsulant enclosing the conductive components 225)—e.g., the conductive components 225 may have a greater cross-sectional area than that of the bond wires. In some embodiments, the conductive components 225 may be formed using the bond wires.

Additionally or alternatively, the conductive components 225 may be configured to connect two or more ground bond pads within a semiconductor device assembly (e.g., semiconductor device assembly 290*a*). So long as the height (e.g., H2) of such conductive components 225 is greater than the final thickness (e.g., H) of the package casing 260, portions of the conductive components 225 may be exposed at the top surface of the package casing 260, e.g., after the CMP process steps, such that the exposed portions of the conductive component 225 may be connected to the conductive shield 275. That is, exposing the conductive components 225 may be accomplished as a result of removing the portion of package casing 260 from the top surface instead of as a result of the dicing process.

Connecting the conductive shield to the ground nodes at the top surface of semiconductor device assembly may be advantageous to further reduce the process cost (e.g., when compared to the embodiment described with reference to FIGS. 2A through 2E) because the ground connection of the conductive shield may be established at the onset of the process that forms the conductive shield 275. That is, an optimum process time (e.g., a shortest duration) may be determined to form a desired thickness of the conductive shield at the sidewall surface of the semiconductor device assembly, proximate to its bottom corner where the step coverage issue may be most severe, so long as the desired thickness is adequate to provide EMI shielding function for the semiconductor device assembly.

Figure 5:
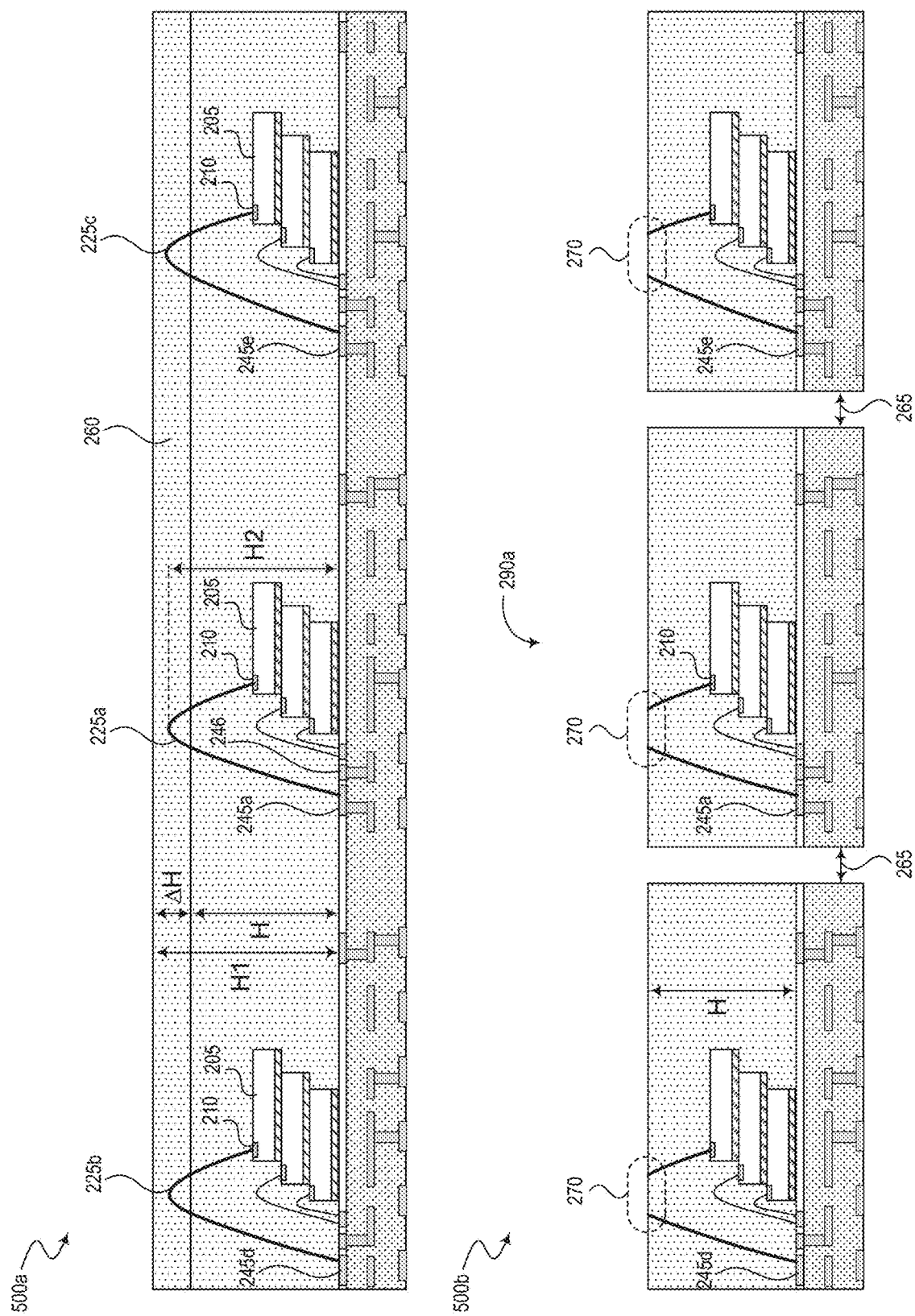

FIG. 5 includes cross-sectional diagrams 500 to illustrate a variation in forming ground connections for semiconductor device assemblies in accordance with an embodiment of the present technology. Diagram 500*a* depicts the die stacks 206 attached to the package support substrate 240, which correspond to the die stacks 206 attached to the package support substrate 240 depicted in the diagram 200*b* of FIG. 2B, except that the thickness H1 of the package casing 260 (e.g., as deposited) is greater than the thickness H of the package casing 260 depicted in the diagram 200*b* and that the conductive components 225 couples the bond pad 210 of the semiconductor die 205 to the ground bond pads 245 (e.g., bond pad 245*a*) for the semiconductor device assemblies (e.g., the semiconductor device assembly 290*a*). In some embodiments, the bond pad 210 may be a dummy bond pad (e.g., a bond pad configured to carry no active signals related to operations of the semiconductor die 205). In some embodiments, the bond pad 210 may be designated to provide a common node (e.g., a ground node) for the semiconductor die 205. Further, the height H2 of the conductive components 225 is greater than the thickness H of the package casing 260 depicted in the diagram 200*b*. Moreover, the thickness H1 of the package casing 260 is greater than the height H2 of the conductive components 225 such that the conductive components 225 is enclosed within the package casing 260 (as deposited).

Subsequently, a top portion of the package casing 260 (i.e., the portion corresponding to the thickness ΔH of the package casing 260) may be removed (e.g., using CMP process steps, strip grinding process steps, or other suitable process steps) as depicted in the diagram 500*b*. The final thickness of the encapsulant of the package casing 260 may be determined to maintain the target height dimension of the semiconductor device assemblies 290 (e.g., the thickness H of the encapsulant described with reference to FIGS. 2B through 2E). As a result of removing the top portion of the package casing 260, the looping portion of the conductive components 225 may be removed to expose portions of the conductive components 225 at the top surface of the package casing 260 (as denoted with the dotted elongated circles 270). Subsequently, the package casing 260 and the package support substrate 240 may be diced through the dicing lanes 265 to singulate the semiconductor device assemblies 290 (e.g., assembly 290a).

When the conductive shields 275 (not shown) is formed on the singulated semiconductor device assemblies (e.g., assembly 290a), respectively, the exposed portions of conductive components 225 may be connected to the conductive shield 275 such that the ground bond pads (e.g., bond pad 245a, bond pad 245d, bond pad 245e) may be connected to the conductive shields 275 at the top surface of the package casing 260. In some embodiments, the conductive components 225 may be mechanically sturdier than bond wires (e.g., bond wires 215 described with reference to FIG. 2A) to maintain the overall shape of the conductive components 225 during subsequent process steps (e.g., depositing the encapsulant enclosing the conductive components 225)— e.g., the conductive components 225 may have a greater cross-sectional area than that of the bond wires. In some embodiments, the conductive components 225 may be formed using the bond wires. Similar to the embodiment described with reference to FIG. 4, exposing the conductive components 225 may be accomplished as a result of removing the portion of package casing 260 from the top surface instead of as a result of the dicing process.

Figure 6:
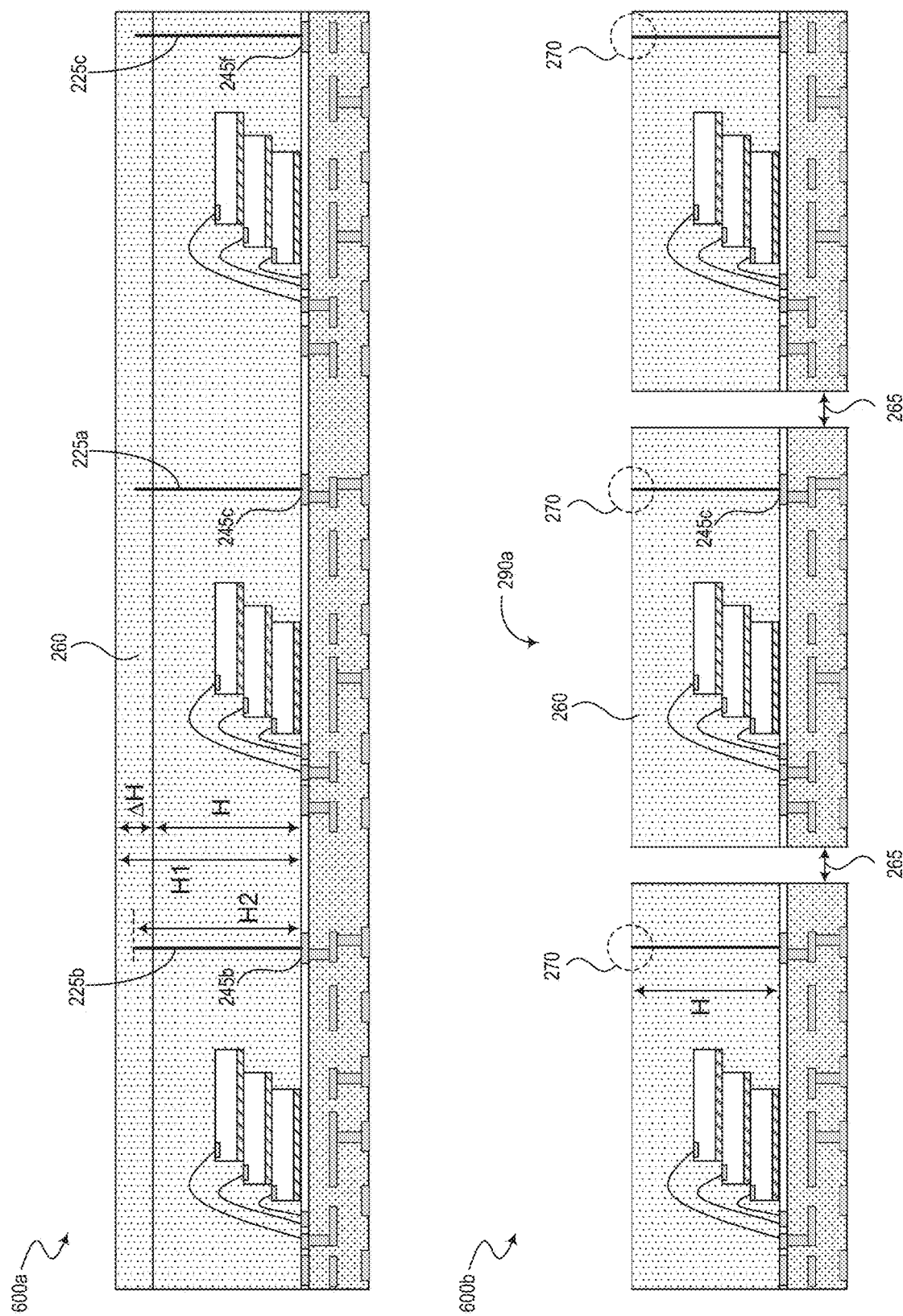
Figure 7:
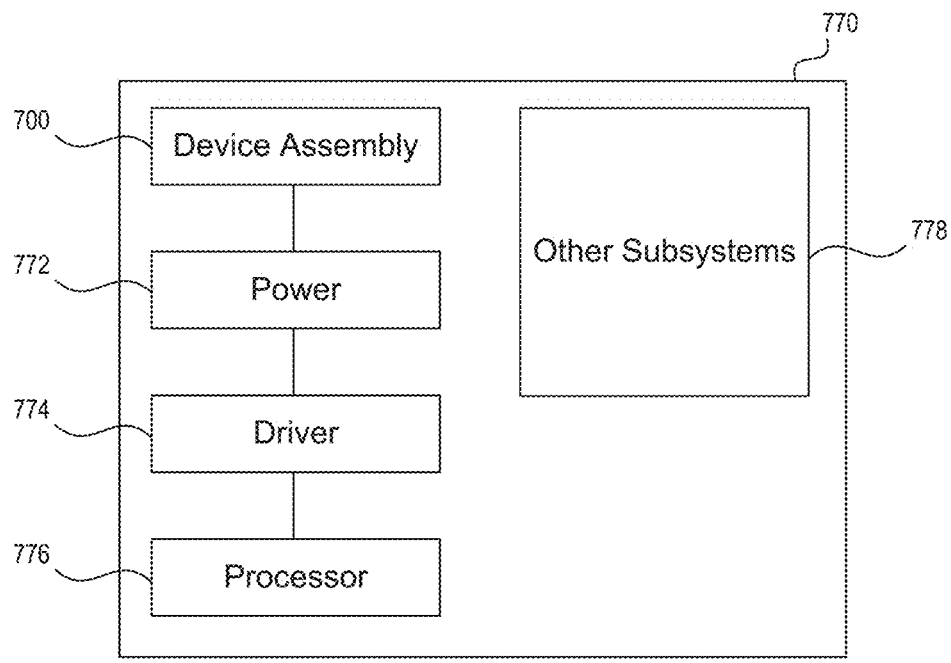
FIG. 7 is a block diagram schematically illustrating a system including a semiconductor device assembly configured in accordance with an embodiment of the present technology.

FIG. 6 includes cross-sectional diagrams 600 to illustrate a variation in forming ground connections for semiconductor device assemblies in accordance with an embodiment of the present technology. Diagram 600a depicts the die stacks 206 attached to the package support substrate 240, which correspond to the die stacks 206 attached to the package support substrate 240 depicted in the diagram 200b of FIG. 2B, except that the thickness H1 of the package casing 260 (as deposited) is greater than the thickness H of the package casing 260 depicted in the diagram 200b and that the conductive components 225 are coupled to the ground bond pads 245 (e.g., bond pad 245c) for the semiconductor device assemblies 290 (e.g., assembly 290a). That is, individual conductive components 225 may be a linear shape extending from the corresponding ground bond pads 245. In some embodiments, the conductive components 225 may be extended to the height H2 from the ground bond pads 245 in a direction perpendicular to the surface of the ground bond pads 245 and the height H2 may be greater than the height of the die stacks 206. The conductive components 225 may be terminated at the height H2 before encapsulating the conductive components 225. Further, the height H2 of the conductive components 225 is greater than the thickness H of the package casing 260 depicted in the diagram 200b. Moreover, the thickness H1 of the package casing 260 is greater than the height H2 of the conductive components 225 such that the conductive components 225 is enclosed within the package casing 260 (as deposited).

Subsequently, a top portion of the package casing 260 (i.e., the portion corresponding to the thickness ΔH of the package casing 260) may be removed (e.g., using CMP process steps, strip grinding process steps, or other suitable process steps) as depicted in the diagram 600b. The final thickness of the encapsulant of the package casing 260 may be determined to maintain the target height dimension of the semiconductor device assemblies 290 (e.g., the thickness H of the encapsulant described with reference to FIGS. 2B through 2E). As a result of removing the top portion of the package casing 260, the top parts of the conductive components 225 may be removed to expose portions of the conductive components 225 at the top surface of the package casing 260 (as denoted with the dotted circles 270). Subsequently, the package casing 260 and the package support substrate 240 may be diced through the dicing lanes 265 to singulate the semiconductor device assemblies 290 (e.g., assembly 290a).

When the conductive shields 275 (not shown) is formed on the singulated semiconductor device assemblies (e.g., semiconductor device assembly 290a), respectively, the exposed portions of conductive components 225 may be connected to the conductive shield 275 such that the ground bond pads (e.g., bond pad 245b, bond pad 245c, bond pad 245f) may be connected to the conductive shields 275 at the top surface of the package casing 260, In some embodiments, the conductive components 225 may be mechanically sturdier than bond wires (e.g., bond wires 215 described with reference to FIG. 2A) to maintain the overall shape of the conductive components 225 during subsequent process steps (e.g., depositing the encapsulant enclosing the conductive components 225)—e.g., the conductive components 225 may have a greater cross-sectional area than that of the bond wires. In some embodiments, the conductive components 225 may include the bond wires.

Any one of the semiconductor device assemblies described above with reference to FIGS. 2 through 7 can be incorporated into any of a myriad of larger and/or more complex systems, a representative example of which is system 770 shown schematically in FIG. 7. The system 770 can include a semiconductor device assembly 700, a power source 772, a driver 774, a processor 776, and/or other subsystems or components 778. The semiconductor device assembly 700 can include features generally similar to the ground connections described herein, and can therefore include various features that enhance electrical characteristics of the ground connections and reduce a process cost for forming such ground connections. The resulting system 770 can perform any of a wide variety of functions, such as memory storage, data processing, and/or other suitable functions. Accordingly, representative systems 770 can include, without limitation, hand-held devices (e.g., mobile phones, tablets, digital readers, and digital audio players), computers, and appliances. Components of the system 770 may be housed in a single unit or distributed over multiple, interconnected units (e.g., through a communications network). The components of the system 770 can also include remote devices and any of a wide variety of computer readable media.

Figure 8:
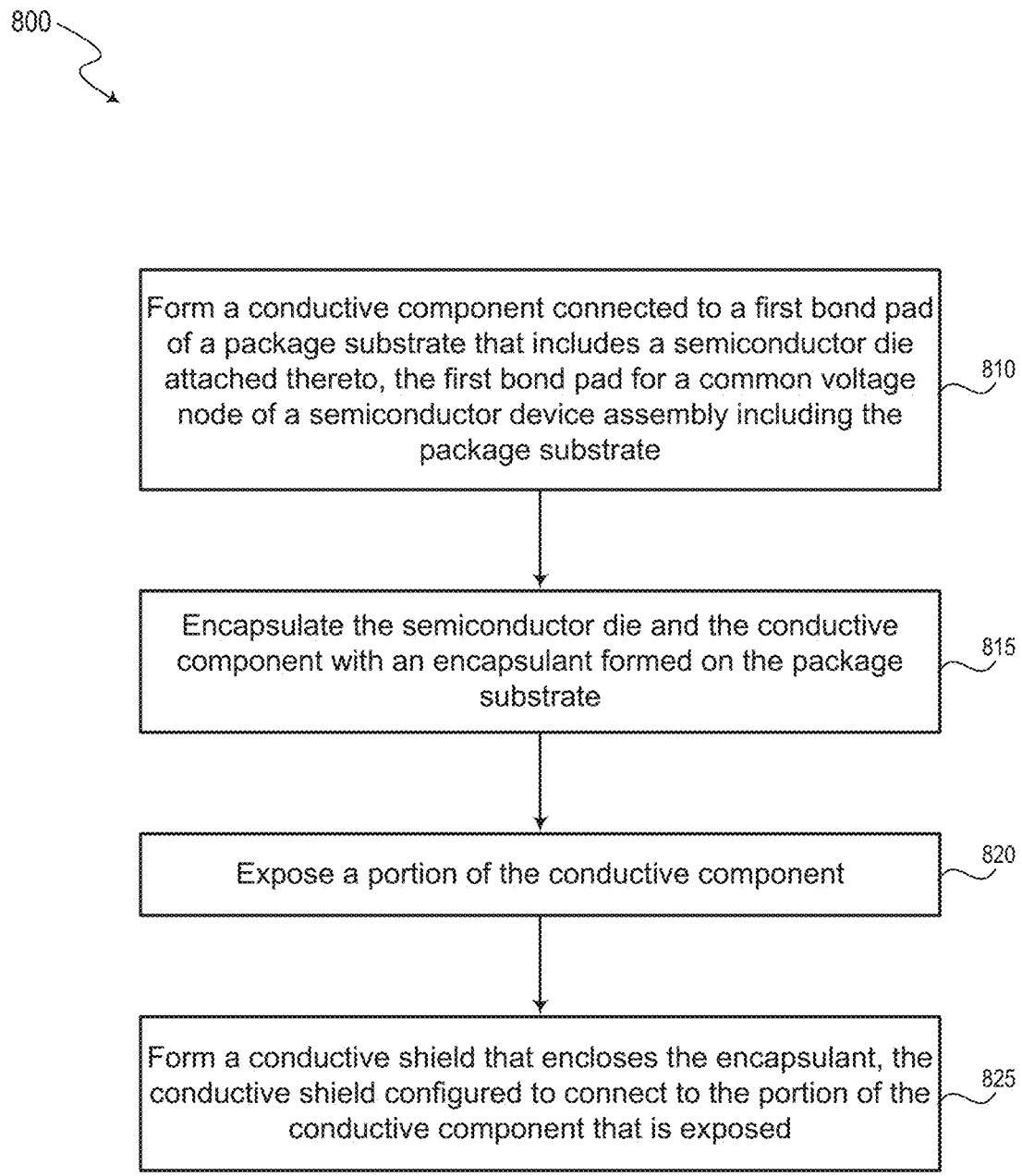
FIGS. 8 and 9 are flowcharts illustrating methods of forming ground connections for semiconductor device assemblies in accordance with embodiments of the present technology.

FIG. 8 is a flowchart 800 illustrating methods of forming ground connections for semiconductor device assemblies in accordance with embodiments of the present technology. The flowchart 800 may include aspects of methods as described with reference to FIGS. 2A-2E, and 3 through 6.

The method includes forming a conductive component connected to a first bond pad of a package substrate that includes a semiconductor die attached thereto, the first bond pad for a common voltage node of a semiconductor device assembly including the package substrate (box 810). The method further includes encapsulating the semiconductor die and the conductive component with an encapsulant formed on the package substrate (box 815). The method further includes exposing a portion of the conductive component (box 820). The method further includes forming a conductive shield that encloses the encapsulant, the conductive shield configured to connect to the portion of the conductive component that is exposed (box 825).

In some embodiments, the method may further include extending the conductive component to a first height from the first bond pad in a direction perpendicular to a surface of the first bond pad, the first height greater than a second height of the semiconductor die, and terminating the conductive component at the first height before encapsulating the conductive component. In some embodiments, the method may further include depositing the encapsulant at a first thickness greater than the first height of the conductive component, where encapsulating the semiconductor die and the conductive component is based on depositing the encapsulant.

In some embodiments, the method may further include removing the encapsulant from a top surface of the encapsulant to a second thickness that is less than the first height of the conductive component and greater than the second height of the semiconductor die, where exposing the portion of the conductive component is based on removing the encapsulant. In some embodiments, the method may further include connecting the conductive component to a second bond pad of the package substrate before encapsulating the semiconductor die and the conductive component, where the first and second bond pads are separated by a dicing lane. In some embodiments, the method may further include singulating the semiconductor device assembly through a dicing lane, where exposing the portion of the conductive component is based on singulating the semiconductor device assembly. In some embodiments, the method may further include connecting the conductive component to a second bond pad of the semiconductor die such that the conductive component includes a first height greater than a second height of the second bond pad.

Figure 9:
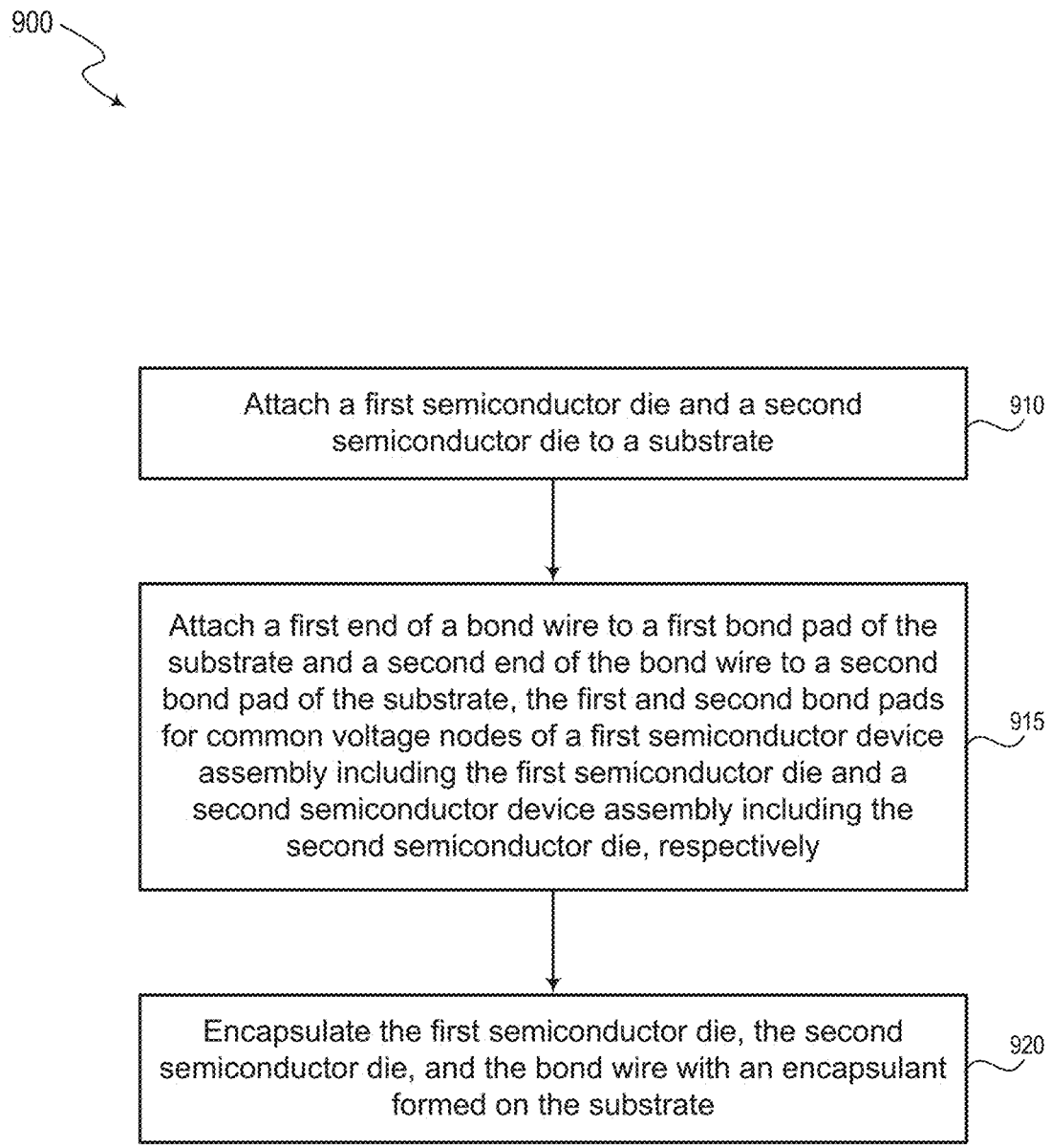

FIG. 9 is a flowchart 900 illustrating a method of forming ground connections for semiconductor device assemblies in accordance with embodiments of the present technology. The flowchart 900 may include aspects of methods as described with reference to FIGS. 2A-2E, and 3 through 6.

The method includes attaching a first semiconductor die and a second semiconductor die to a substrate (box 910). The method further includes attaching a first end of a bond wire to a first bond pad of the substrate and a second end of the bond wire to a second bond pad of the substrate, the first and second bond pads for common voltage nodes of a first semiconductor device assembly including the first semiconductor die and a second semiconductor device assembly including the second semiconductor die, respectively (box 915). The method further includes encapsulating the first semiconductor die, the second semiconductor die, and the bond wire with an encapsulant formed on the substrate (box 920).

In some embodiments, the method may further include severing the bond wire by dicing the substrate with the encapsulant formed thereon through a dicing lane located between the first and second bond pads. In some embodiments, the method may further include forming a conductive shield on a sidewall surface of the encapsulant that has been diced, the conductive shield connected to a portion of the bond wire that has been exposed after severing the bond wire. In some embodiments, the first semiconductor die is attached to the substrate via one or more third semiconductor dies such that the first semiconductor die is a top most semiconductor die of a first stack of semiconductor dies including the first semiconductor die and the one or more third semiconductor dies, and the second semiconductor die is attached to the substrate via one or more fourth semiconductor dies such that the second semiconductor die is a top most semiconductor die of a second stack of semiconductor dies including the second semiconductor die and the one or more fourth semiconductor dies.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the technology have been described herein for purposes of illustration, but that various modifications may be made without deviating from the disclosure. For example, although the embodiments of forming ground connections for the semiconductor device assemblies are described with respect to stacks of semiconductor dies attached to a package support substrate, other embodiments of the semiconductor device assemblies can be configured, for example, to include individual semiconductor dies attached to the package support substrate. In addition, while in the illustrated embodiments certain features or components have been shown as having certain arrangements or configurations, other arrangements and configurations are possible. For example, a quantity of the bond pads of the package support substrate can be a larger or smaller than shown in the illustrated embodiments. In addition, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
   a semiconductor die;
   a package substrate supporting the semiconductor die, the package substrate including a first bond pad for a common voltage node of the semiconductor device assembly;
   a first bond wire configured to directly connect the first bond pad to a conductive shield that surrounds a package casing formed on the package substrate; and
   a second bond wire configured to directly connect a second bond pad of the semiconductor die to the conductive shield, wherein the package casing includes an encapsulant that encloses the semiconductor die and the first and second bond wires.

2. The semiconductor device assembly of claim 1, wherein the first bond wire terminates at a sidewall surface of the package casing to connect to the conductive shield.

3. The semiconductor device assembly of claim 1, wherein the first bond wire extends to a top surface of the package casing where it connects to the conductive shield.

4. The semiconductor device assembly of claim 1, wherein the first bond pad is on an upper surface of the package substrate to which the semiconductor die is mounted.

5. The semiconductor device assembly of claim 1, wherein the conductive shield surrounds a perimeter of the package substrate.

6. The semiconductor device assembly of claim 1, further comprising:
   a third bond pad of the package substrate configured to connect to the common voltage node; and
   a third bond wire coupling the third bond pad with the conductive shield.

7. The semiconductor device assembly of claim 1, further comprising:
   a third bond wire configured to couple a third bond pad of the semiconductor die with a fourth bond pad of the package substrate, wherein:
   the first bond wire includes a first cross-sectional area greater than a second cross-sectional area of the third bond wire.

8. The semiconductor device assembly of claim 1, wherein the semiconductor die is a first semiconductor die, and the semiconductor device assembly further comprises:
   one or more second semiconductor dies, wherein:
   the first semiconductor die is attached to the package substrate via the one or more second semiconductor dies such that the first semiconductor die is a top most semiconductor die of a stack of semiconductor dies including the first semiconductor die and the one or more second semiconductor dies.

* * * * *